(12) United States Patent
Agullo

(10) Patent No.: US 9,322,437 B2
(45) Date of Patent: Apr. 26, 2016

(54) SUPPORT FOR SOLAR ENERGY COLLECTION

(71) Applicant: SunPower Corporation, San Jose, CA (US)

(72) Inventor: Vicent Ripoll Agullo, San Francisco, CA (US)

(73) Assignee: SUNPOWER CORPORATION, San Jose, CA (US)

(*) Notice: Subject to any disclaimer, the term of this patent is extended or adjusted under 35 U.S.C. 154(b) by 25 days.

(21) Appl. No.: 13/730,648

(22) Filed: Dec. 28, 2012

(65) Prior Publication Data

US 2014/0182654 A1 Jul. 3, 2014

(51) Int. Cl.
H01L 31/042 (2014.01)
F16C 23/02 (2006.01)
F16C 35/02 (2006.01)
F16C 23/04 (2006.01)
F24J 2/54 (2006.01)
H01L 31/054 (2014.01)
H02S 20/10 (2014.01)

(52) U.S. Cl.
CPC .............. *F16C 35/02* (2013.01); *F16C 23/04* (2013.01); *F24J 2/541* (2013.01); *H01L 31/0547* (2014.12); *H02S 20/10* (2014.12); *H02S 20/32* (2014.12); *F16C 2380/00* (2013.01); *F24J 2002/5451* (2013.01); *F24J 2002/5468* (2013.01); *F24J 2002/5482* (2013.01); *Y02E 10/47* (2013.01)

(58) Field of Classification Search
CPC ..... H01L 31/0422; F16C 35/02; F16C 23/04; F16C 23/02; H02S 20/32; F24J 2/541; Y02E 10/47

USPC .......................................... 136/246; 384/205
See application file for complete search history.

(56) References Cited

U.S. PATENT DOCUMENTS

| 2,737,707 | A | * | 3/1956 | Highet et al. ............ 29/898.056 |
|---|---|---|---|---|
| RE32,764 | E | * | 10/1988 | Smith et al. .................... 384/275 |
| 2007/0274618 | A1 | * | 11/2007 | Sandin .......................... 384/212 |
| 2008/0251115 | A1 | | 10/2008 | Thompson et al. |
| 2009/0265947 | A1 | * | 10/2009 | Sanders ........................... 33/517 |
| 2011/0041834 | A1 | * | 2/2011 | Liao ............................. 126/605 |
| 2012/0027328 | A1 | * | 2/2012 | Inagaki et al. ................ 384/129 |
| 2012/0152308 | A1 | | 6/2012 | Miller et al. |
| 2012/0180845 | A1 | | 7/2012 | Cole et al. |
| 2012/0279489 | A1 | | 11/2012 | Vogt |

FOREIGN PATENT DOCUMENTS

KR  10-2011-0048497  5/2011

OTHER PUBLICATIONS

International Search Report and Written Opinion mailed Mar. 27, 2014, from International Application No. PCT/US2013/074289 filed Dec. 11, 2013, 10 pages.

* cited by examiner

Primary Examiner — Jeffrey T Barton
Assistant Examiner — Tae-Sik Kang
(74) Attorney, Agent, or Firm — Knobbe, Martens, Olson & Bear LLP

(57) ABSTRACT

A solar energy collection system can include support devices made with bearings. Such bearings can include an inner partially toroidal surface for sliding contact and support of an outer surface of a torque tube. The toroidal surface can be made with a single radius of curvature or multiple radiuses of curvature and cylindrical portions. The bearings can include connectors for connecting the bearing members to a support housing. The connectors can be tool-less connectors.

22 Claims, 9 Drawing Sheets

SUPPORT FOR SOLAR ENERGY COLLECTION

TECHNICAL FIELD

The inventions disclosed herein generally relate to solar energy systems which include supports for solar energy collection collecting devices.

BACKGROUND

Some larger solar collector installations include an array of sun-tracking, solar power collector assemblies. Such assemblies can be used in conjunction with photovoltaic modules, concentrated photovoltaic modules, as well as concentrated thermal solar collector devices.

Such sun-tracking collectors include hardware for automatically adjusting the position of the collector devices to track the sun as it moves across the sky. This tracking movement can be accomplished in a number of different ways. Some systems use a single axis tracking system in which the collector devices pivot about a single axis. Such single axis type tracking systems often include a drive shaft or "torque tube" which defines a single pivot axis. Other systems use multiple axes of rotation.

Because the torque tubes pivot through a limited range of rotation about the axis, conventional roller bearings are not necessary for such applications; they would be an unnecessarily large expense or such an application. Thus, some sun-tracking solar systems include other types of bearings.

BRIEF SUMMARY

An aspect of at least one of the inventions disclosed herein includes the realization that bearings for sun-tracking solar energy collection systems can be simplified while also for accommodating misalignment that can be caused during installation. For example, some bearings used to support torque tubes of a sun-tracking solar collection system require that the pivot axis of the torque tube be precisely aligned with the rotational axis of the bearing. This can be a difficult alignment to achieve during installation because the components of sun-tracking solar systems can be quite large and heavy.

Thus, in accordance with at least one of the embodiments disclosed herein, a sun-tracking photovoltaic solar collector array can comprise a plurality of photovoltaic devices. A support assembly can support the photovoltaic devices so as to be pivotable about a pivot axis. The support assembly can comprise at least a first pivot supporting the plurality of photovoltaic modules, at least a first bearing supporting the first pivot so as to be pivotable about the pivot axis and at least one pier supporting the bearing at a position above the support surface. The bearing comprising an inner surface that is at lease partially toroidal.

In accordance with another embodiment a sun-tracking photovoltaic solar collector array can comprise a plurality of photovoltaic devices. A support assembly can support the photovoltaic devices so as to be pivotable about a pivot axis. The support assembly can comprise at least a first pivot supporting the plurality of photovoltaic modules and having an outer surface. At least a first bearing can support the first pivot so as to be pivotable about the pivot axis. At least one pier can support the bearing at a position above a support surface. The bearing can comprise at least a first reduced friction member comprising an inner surface positioned so as to slide against the outer surface of the pivot when the first pivot pivots about the pivot axis, the inner surface being at least partially toroidal.

In accordance with yet another embodiment a bearing assembly can comprise a bearing housing. The bearing housing can have a fixture portion configured to be secured so as to be fixed relative to the ground. The bearing housing can further comprise at least a first bearing seat configured to support the first bearing member. A first bearing member can have an outer surface adapted to be supported by the bearing seat and an inner surface configured to slidably support a shaft, the inner surface being at least partially toroidal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
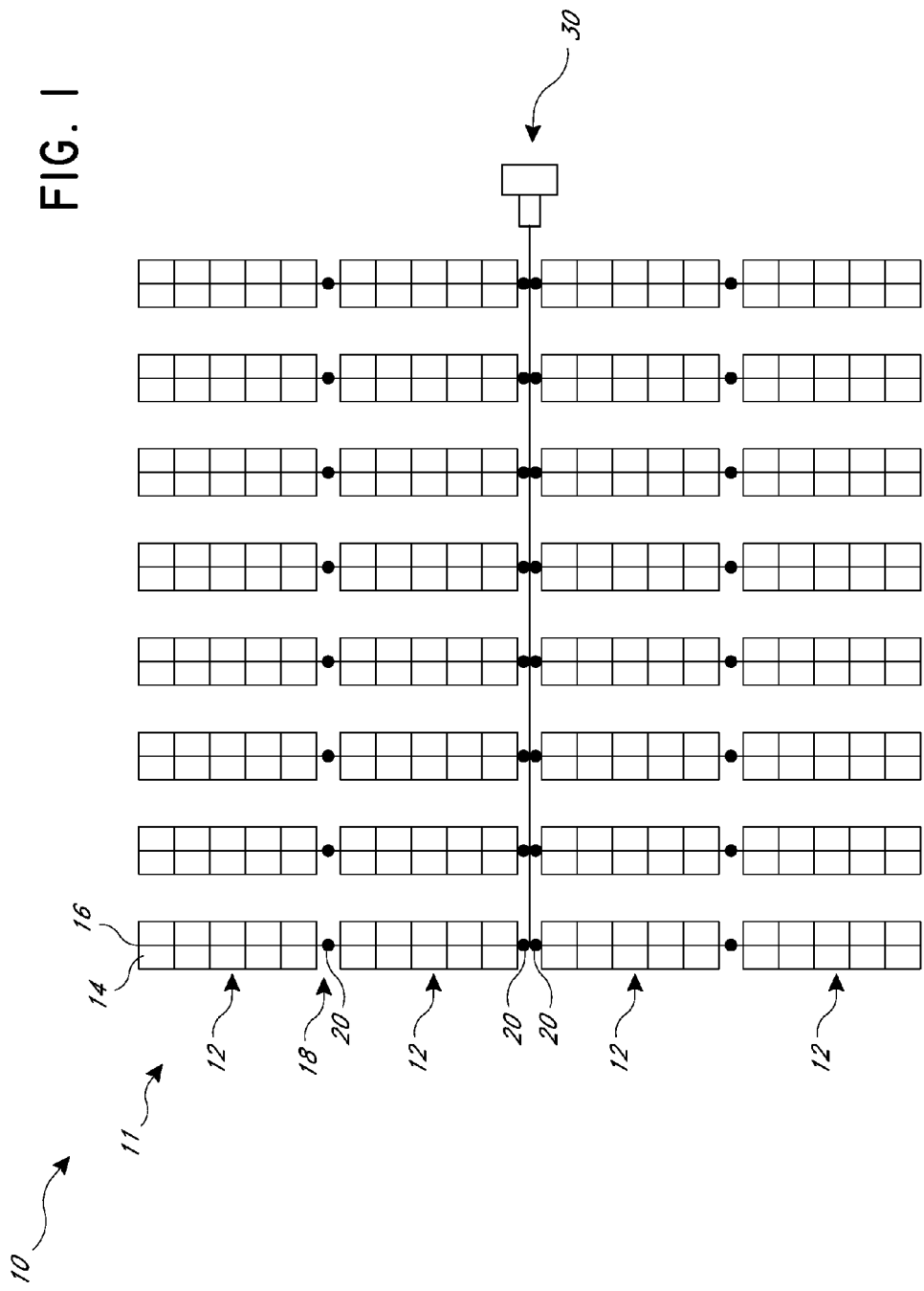
FIG. 1 is a schematic top plan view of a solar collector system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the proceeding technical field, background, brief summary, or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

The inventions disclosed herein are described in the context of non-concentrated and concentrated photovoltaic arrays and modules. However, these inventions can be used in other contexts as well, such as concentrated thermal solar systems, etc.

In the description set forth below, a solar energy collection system 10 is described in the context of being formed by a plurality of solar collection modules, pivotally adjusted for sun-tracking purposes by a drive. Each of the modules can include a support member supporting a plurality of solar collection devices, which can be concentrated or nonconcentrated solar collection devices as well as wiring for connecting the various solar collection devices to each other and to other modules.

The system 10 can also include devices for reducing labor, hardware, or other costs associated with installing such a system. Specifically, for example, a sun-tracking solar energy collection system can include bearing assemblies that include one or more features designed to reduce the cost of manufacture and/or installation of such bearings.

FIGS. 1-4 illustrate different environments in which the inventions disclosed herein can be used. FIG. 1 is a schematic illustration of a solar collection system 10, which can be considered an electricity farm operating under a concentrated or non-concentrated principle.

The solar collection system 10 can include a solar collector array 11 which includes a plurality of solar collection modules 12. Each of the solar collection modules 12 can include a plurality of solar collecting devices 14 supported by a drive shaft or torque tube 16. Each of the torque tubes 16 are supported above the ground by a support assembly 18. Each of the support assemblies 18 can include a pile and a bearing assembly 20. As such, the torque tubes 16 can be considered as pivots supporting the modules 12.

With continued reference to FIG. 1, the system 10 can also include a tracking system 30 connected to the torque tubes 16 and configured to pivot the torque tube 16 so as to cause the associated collector devices 14 to track the movement of the sun. In the illustrated embodiment, the torque tubes 16 are arranged generally horizontal and the modules 12 are electrically connected to each other, as more fully described in U.S. patent application Ser. No. 13/176,276, filed Jul. 5, 2011, the entire contents of which is hereby expressly incorporated by reference. The tracking system can include a single motor and drive components adapted to drive a plurality of parallel torque tube assemblies (e.g., assemblies comprising a series of axially aligned torque tubes connected end-to-end), or a plurality of motors, each connected one or a plurality of axially aligned torque tubes 16.

Optionally, the system 10 can include a plurality of modules 12 supported by torque tubes 16 that are inclined relative to horizontal, wherein the torque tubes 16 are not connected in an end to end fashion, such as the arrangement illustrated and disclosed in U.S. Patent Publication No. 2008/0245360. The entire contents of the 2008/0245360 patent publication is hereby expressly incorporated by reference including the illustrations and the descriptions of the bearings 40 and 72. Further, the inventions disclosed herein can be used in conjunction with the systems that provide for controlled tilting about two axes, although not illustrated herein.

The solar collection devices 14 can be in the form of photovoltaic panels, thermal solar collection devices, concentrated photovoltaic devices, or concentrated thermal solar collection devices.

Figure 2:
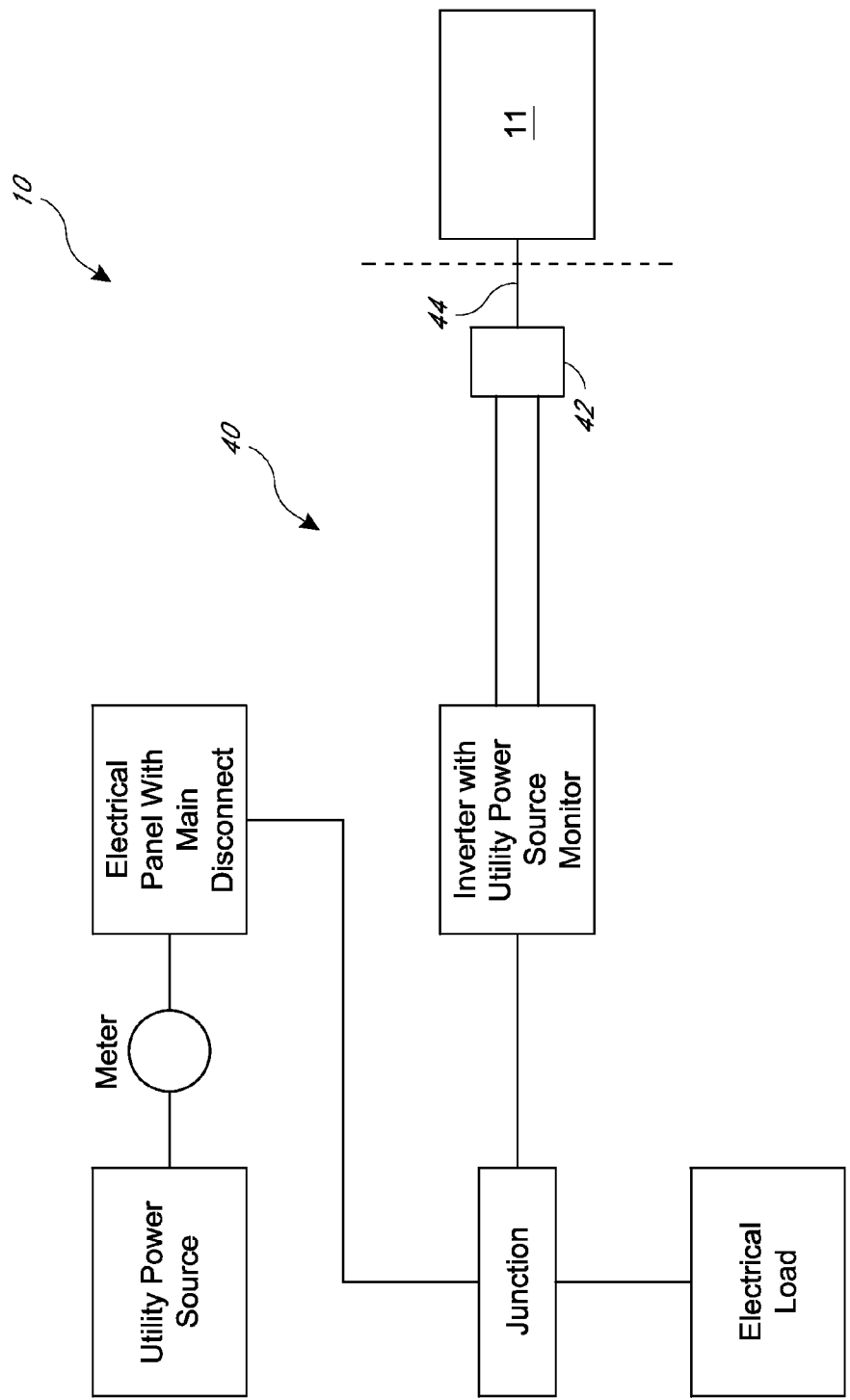
FIG. 2 is a schematic diagram of the system illustrated in FIG. 1 including optional electrical connections of the collector system with various electrical components.

With reference to FIG. 2, the solar collection system 10 can further include an electrical system 40 connected to the array 11. For example, the electrical system 40 can include the array 11 as a power source connected to a remote connection device 42 with power lines 44. The electrical system 40 can also include a utility power source, a meter, an electrical panel with a main disconnect, a junction, electrical loads, and/or an inverter with the utility power source monitor. The electrical system 40 can be configured and can operate in accordance with the descriptions set forth in U.S. Patent Publication No. 2010/0071744, the entire contents of which is hereby expressly incorporated by reference.

Figure 3:
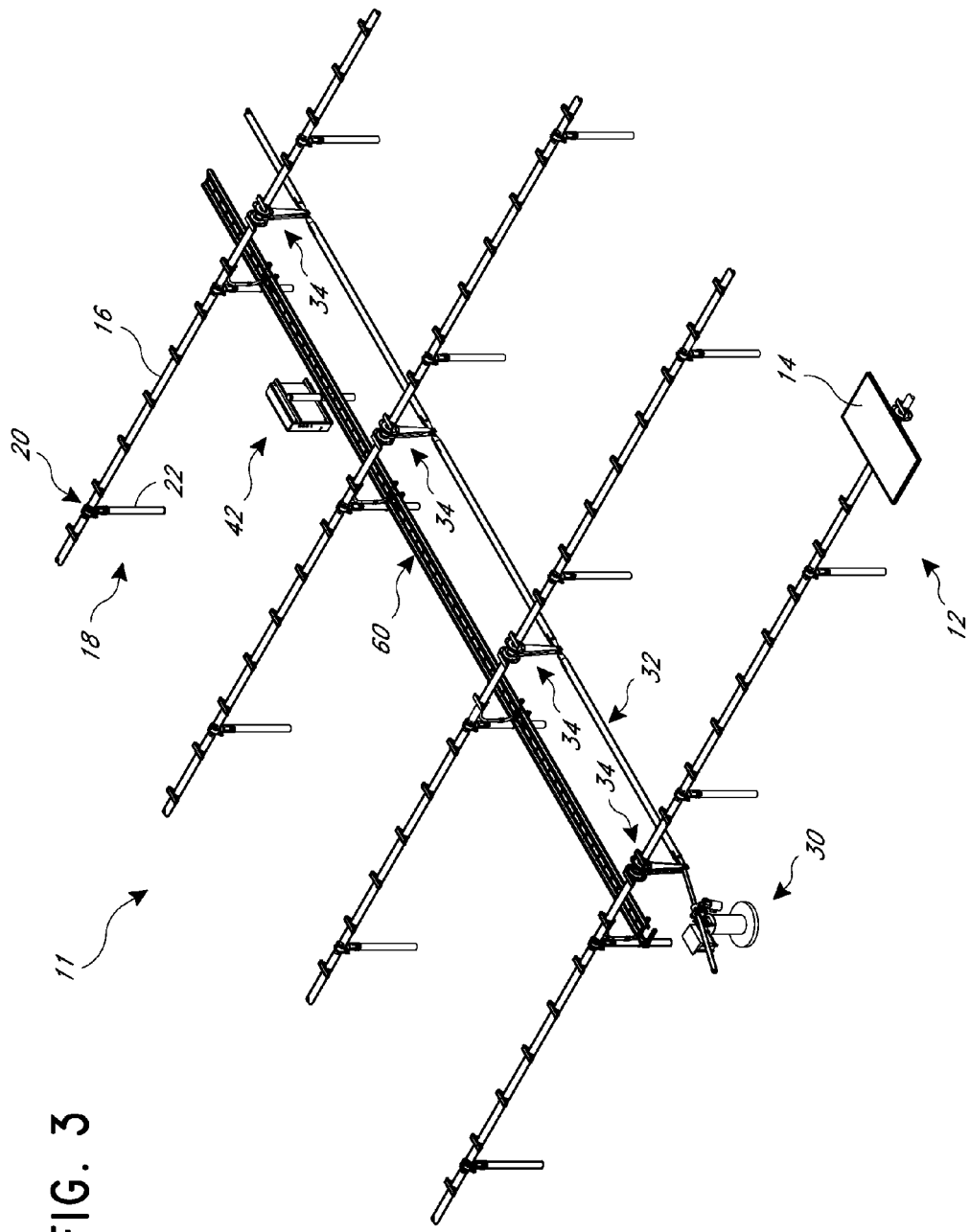
FIG. 3 is a perspective view of a non-concentrated photovoltaic embodiment of the solar collection system of FIG. 1, illustrating a plurality of piers mounted to the ground and supporting a plurality of torque tubes, in which the present bearing can be used.

FIG. 3 illustrates a non-concentrated photovoltaic, sun-tracking embodiment of the array 11 with all but one of the solar collection devices 14 removed. As shown in FIG. 3, each of the support assemblies 18 includes the bearing 20 supported at the upper end of a pile 22. The torque tube 16 can be of any length and can be formed in one or more pieces. The spacing of the piers 22 relative to one another, can be determined based on the desired limits on deflection of the torque tubes 16 between the support structures 18, wind loads, and other factors.

The tilt drive 30 can include a drive strut 32 coupled with the torque tube 16 in a way that pivots the torque tube 16 as the drive strut 32 is moved axially along its length. The drive strut 32 can be connected with the torque tube 16 with torque arm assemblies 34. In the illustrated embodiment, the torque arm assemblies 34 disposed at an end of each of the torque tube 16. Additionally, the array 11 can include an electrical wire tray 60 supported by one or more of the piers 22, or by other means.

Figure 4:
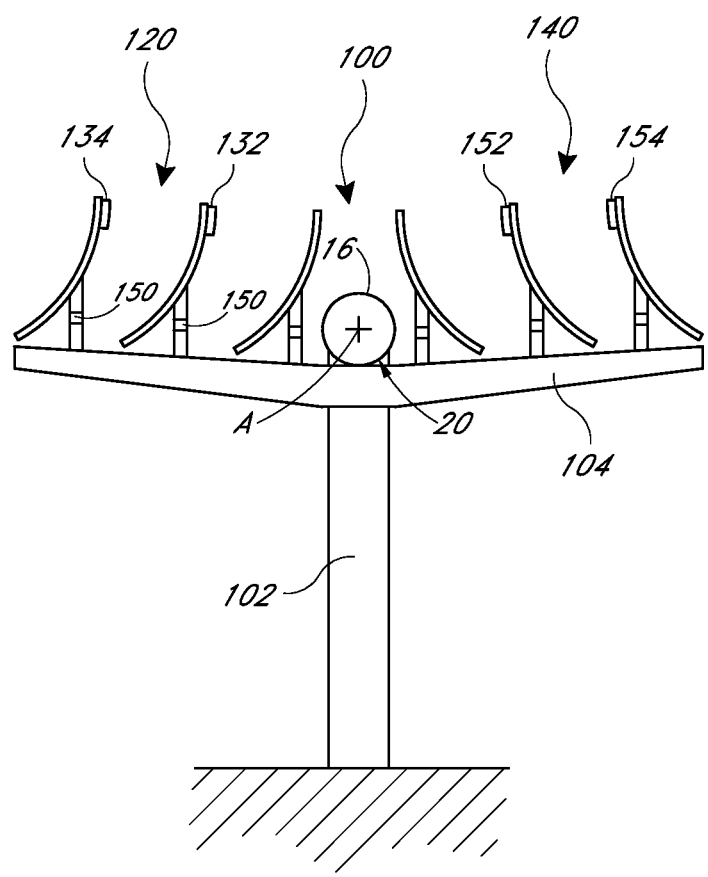
FIG. 4 is a schematic side elevational view of a solar collector assembly for a concentrated photovoltaic embodiment of the solar collection system of FIG. 1, in which the present bearing can also be used.
Figure 5:
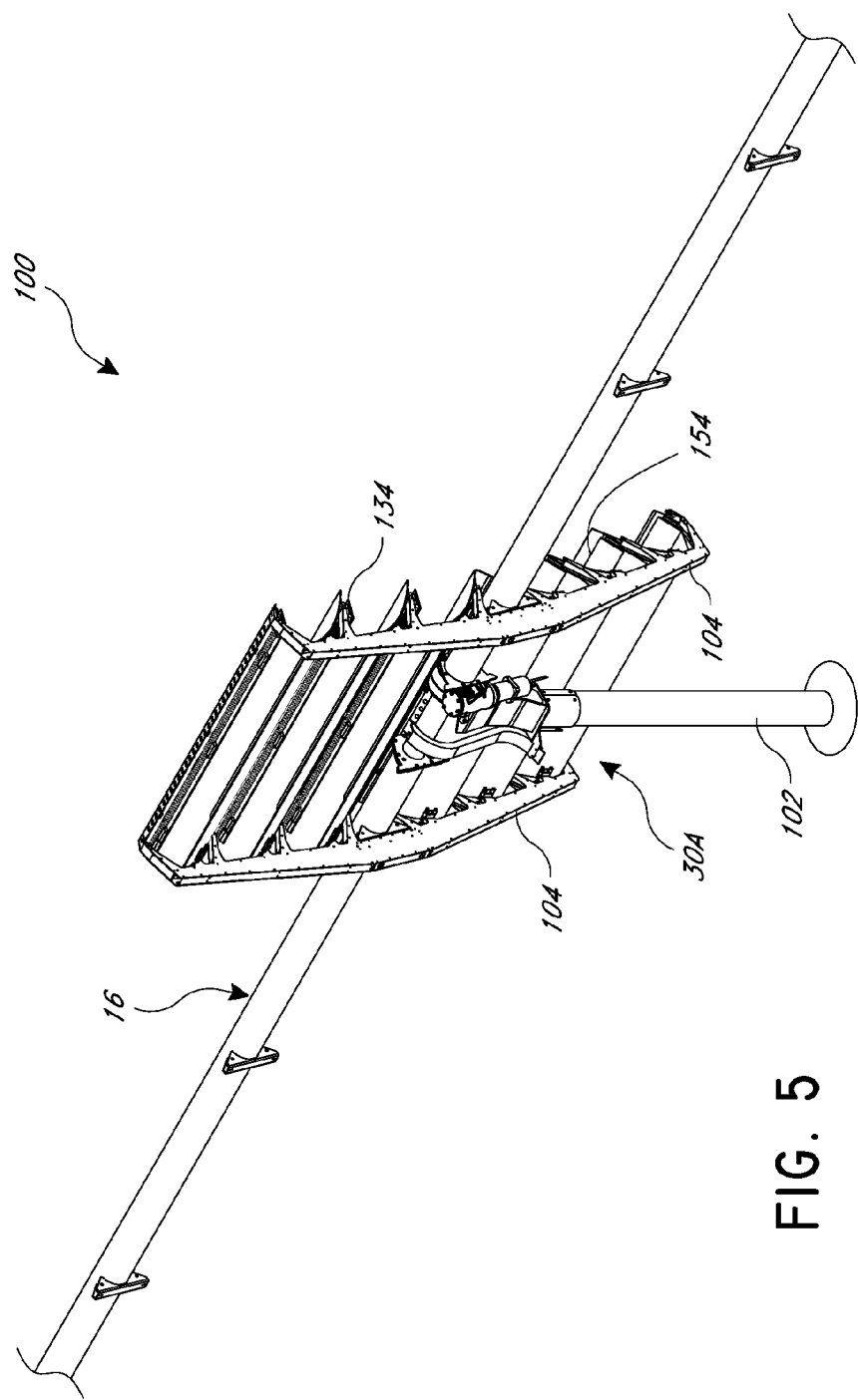
FIG. 5 is a perspective view of the embodiment of FIG. 4 and including a sun-tracker drive.

FIGS. 4 and 5 illustrate components of a concentrated photovoltaic, sun-tracking embodiment of the array 11. For example, as schematically shown in FIG. 4, a concentrated photovoltaic solar assembly 100 can include a pile 102 which supports one or more cross beams 104 and a torque tube 106. The cross beam 104 in turn supports first and second groups of concentrating elements 120, 140, supported by the cross beam 104.

In the illustrated embodiment, one group of concentrating elements 120 face in one direction and the second group of concentrating elements 140 are positioned so as to face the opposite direction, with the changeover between them occurring at the torque tube 106. The pier 102 can be a single post or one of several supporting the solar concentrator assembly 100.

Connectors 150 support the concentrator elements 120, 140 relative to the cross beam 104. Additionally, photovoltaic collectors 132, 134, 152, 154 can be mounted on the back sides of the concentrator elements 120, 140. In this configuration, each of the concentrator elements 120, 140 are configured to focus a band of concentrated light onto the photovoltaic units 132, 134, 152, 154. A sun-tracking drive system 200 can drive the torque tube 16 to pivot about the pivot axis A. Further detail regarding the optional configuration of a concentrated photovoltaic environment of use is set forth in U.S. patent application Ser. No. 12/977,006 filed Dec. 22, 2010, the entire contents of which is hereby incorporated by reference.

Figure 6:
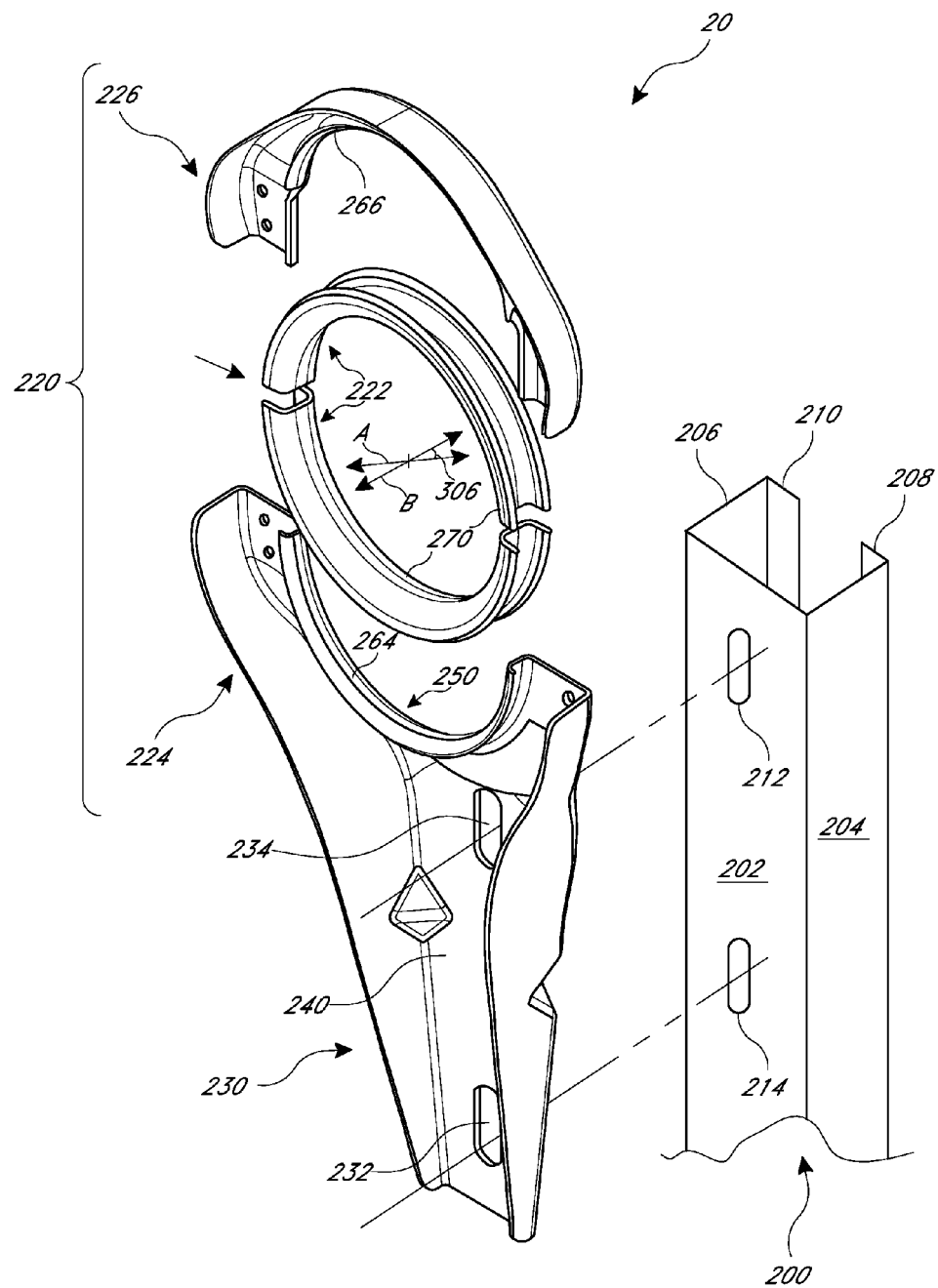
FIG. 6 is an exploded view of a bearing assembly in accordance with an embodiment having upper and lower bearing members and upper and lower bearing housing portions.

The bearings 20 can be supported directly on piers 102 described above with reference to FIGS. 1-4. Optionally, the bearing assemblies 20 can optionally be supported by piers 200 (FIG. 6). The piers 200 can be in the form of structural channel members, such as steel channel that is widely commercially available. Such piers 200 can include a web portion 202 and flanges 204, 206. Optionally, the pier 200 can include additional inwardly extending flanges 208, 210. Such piers 200 can be pile driven into the ground and/or further secured with cement foundations.

During installation of such piers 200, the pile driving process and/or creation of foundations can cause the piers 200 to be misaligned, either as to their height, lateral, and parallel alignment relative to the rotational axes A of the torque tubes 16.

Thus, the piers 200 can include oval apertures 212, 214 to accommodate at least some of the misalignment that can occur in the installation of the piers 200. Other pier designs can also be used.

Figure 7:
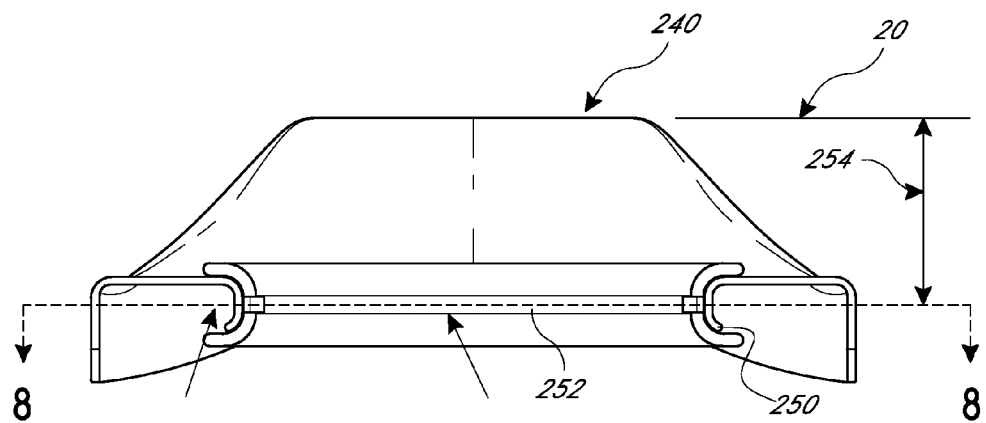
FIG. 7 is a top plan view of a lower portion of the housing and the lower bearing member illustrated in FIG. 6.
Figure 8:
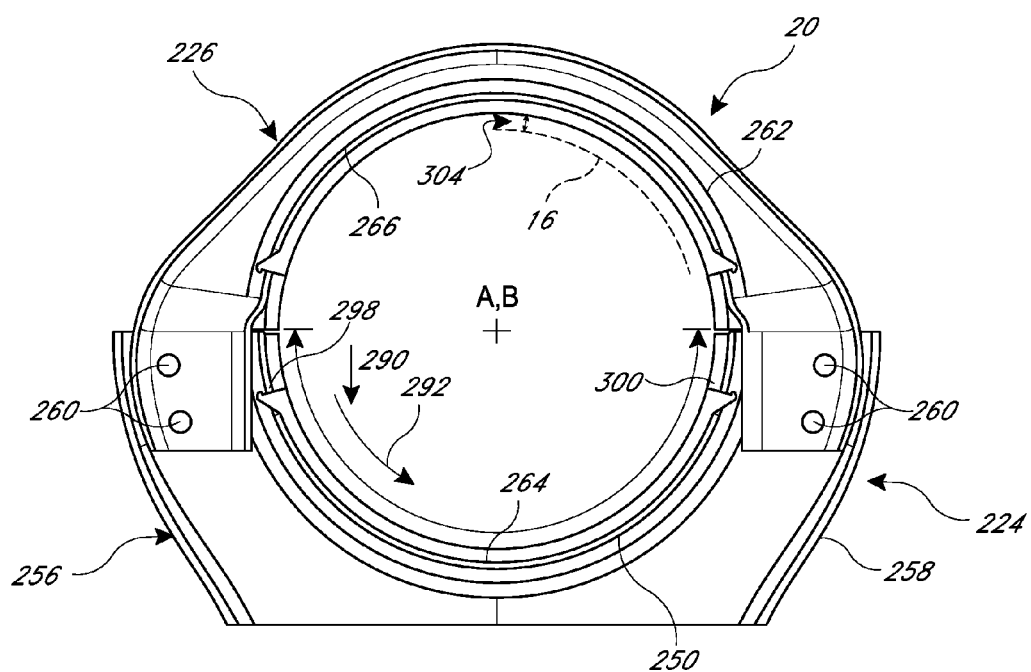
FIG. 8 is a sectional view of the assembled housing illustrated in FIG. 6 as viewed along the line 8.-8. of FIG. 7.

With reference to FIGS. 6-8, an embodiment of a bearing assembly 20 is illustrated therein. It is to be noted that in a solar energy collection system 10, there may be many bearings supporting each of the torque tube 16. However, one bearing assembly 20 is illustrated and described herein with the understanding that many such bearing assemblies 20 can be used throughout the system 10.

The bearing assembly 20 can include a bearing housing assembly 220 and a bearing member assembly 222.

The bearing housing 220 can be made from one or more parts connected together. For example, the bearing housing 220 can include a lower housing portion 224 and an upper housing portion 226.

The lower portion 224 of the housing 220 can include a fixture portion 230 configured to be securely connected to a pier, such as the pier 200. In the illustrated embodiment, the fixture portion 230 includes two slot shaped apertures 232, 234 sized to accommodate threaded fasteners (not shown) which can pass through the apertures 232, 214, 234, and 212 to thereby secure the fixture portion 230 to the pier 200. Additionally, the slot shape of each of the apertures 212, 214, 232, 234 allows the fixture portion 230 to be fixed to the pier 200 with a range of positions so as to allow an installer, after the pier 200 is fixed to ground surface, to adjust the position of the fixture so as to achieve the desired alignment of the bearing assembly 20 with the desired location of a torque tube 16.

Optionally, the fixture portion 230 can include a generally planar face portion 240 configured to lie flat against the web portion 202 of the pier 200. The apertures 232, 234 can be provided in the face portion 240.

The lower portion 224 of the housing 220 can also include a bearing seat portion 250. The bearing seat portion 250, optionally, can be configured to support a portion of a bearing member. For example, the bearing seat portion 250 can be configured to extend around and support a portion of a bearing member so as to support at least about one-third to about one-half of a bearing member from below.

This can provide a further advantage in that when a solar energy collection system 10 is being installed, the lower portion 224 of the housing can be fixed in place, along with a portion of a bearing member, and then the torque tubes 16 can be lowered down onto the lower portion 224 on an associated bearing member. Then, the remaining portion of the bearing assembly 20 can be completed. This is convenient because torque tube assemblies can be quite long and heavy.

In the illustrated embodiment, the bearing support portion 250 is generally semi-circular and extends around about a 180 degree arc, as illustrated in FIG. 8. Other configurations can also be used.

In the configuration where the lower portion 224 extends around about 180 degrees of a central axis B of the bearing assembly 20, the upper portion 226 can also include a bearing seat having a complimentary shape to provide a seat extending around the full 360 degrees around the axis A, described in further detail below.

The seat 250 can include a center line that is generally offset from the face 240. For example, as shown in FIG. 7, the center line 252 of the seat 250 can be spaced apart by a distance 254. This offset can be helpful in balancing loads imparted onto the pier 200. For example, when using a pier such as the pier 200 which has a C channel configuration, offsetting the centerline of the bearing seat 250 from the web 202 can help balance the reactionary forces caused by the pier 200 when the bearing assembly 220 is subjected to lateral loads (i.e., loads that are perpendicular to the axis A). For example, as is well known in the art, when a channel beam is subjected to a lateral load, i.e., perpendicular to its webs and directed toward a point within the cross-section of the C-shape, such a force can result in a torsional load on the beam based on the moment of inertia of the beam. Thus, by offsetting the center line 252 (FIG. 7) of the bearing seat 250 away from the web 202 (FIG. 6), the resulting load on the pier 200 can be more of a pure bending load, which can thereby prevent the bearing seat 250 from being twisted relative to the axis A (i.e., twisted about an axis that extends generally vertically as viewed in FIG. 6). The spacing 254 can be calculated based on known techniques.

The lower portion 224 can also include lateral flanges that extend from the lower end of the fixture portion 230 up to the upper end of the lower portion 224. The flanges are identified by the reference numerals 256, 258. The size of the flanges 256, 258 as well as the face portion 240 and the bearing seat 250 can be chosen to provide the desired stiffness.

The upper end of the lower portion 224 can include apertures 260 that can be used for securing the lower portion 224 to the upper portion 226.

The upper portion 226 can also include, at its lower end, apertures 260 positioned and spaced so as to align with the apertures 260 in the lower portion 224, when the upper and lower portions 226, 224 are brought together in the orientation illustrated in FIG. 8.

The upper portion 226 can also include a bearing seat portion 262 that extends around the axis B, (when in the position illustrated in FIG. 8) so as to compliment the seat 250 of the lower portion 224 and to provide support for the bearing members 222.

In the illustrated embodiment, the bearing seats 250, 262 have a generally C-shaped cross-section (as illustrated in FIG. 7). In the illustrated embodiment, the inner surface 264 of the bearing seat 250 and the inner surface 266 of the bearing seat 262 have a partially toroidal shape, more specifically, the portion of a toroid around the central aperture of a toroid. However, other shapes can also be used.

Additionally, the bearing seats 250, 262 can be made in other proportions. For example, the lower portion 224 can have a bearing seat 250 that extends only about 90 degrees about the axis A and the upper portion can include one or pieces extending over the remaining 360 degrees around the axis A. Similarly, the lower portion 224 can include a bearing seat 250 that extends around about 120 degrees, with the upper portion 226, made in one or more parts, extending around the remaining 240 degrees around the axis A. Additionally, the bearing seats 250, 262 can be noncontinuous, i.e., they can be formed in only segments with gaps between them extending around the axis A. Other configurations can also be used. Further, the inner surfaces 264, 266 can be shaped to compliment the outer surface of the bearing members 222. Thus, if the bearing members 222 have outer surfaces that are different than in the illustrated embodiments, the outer surfaces 264, 266 can have different configurations.

Figure 9:
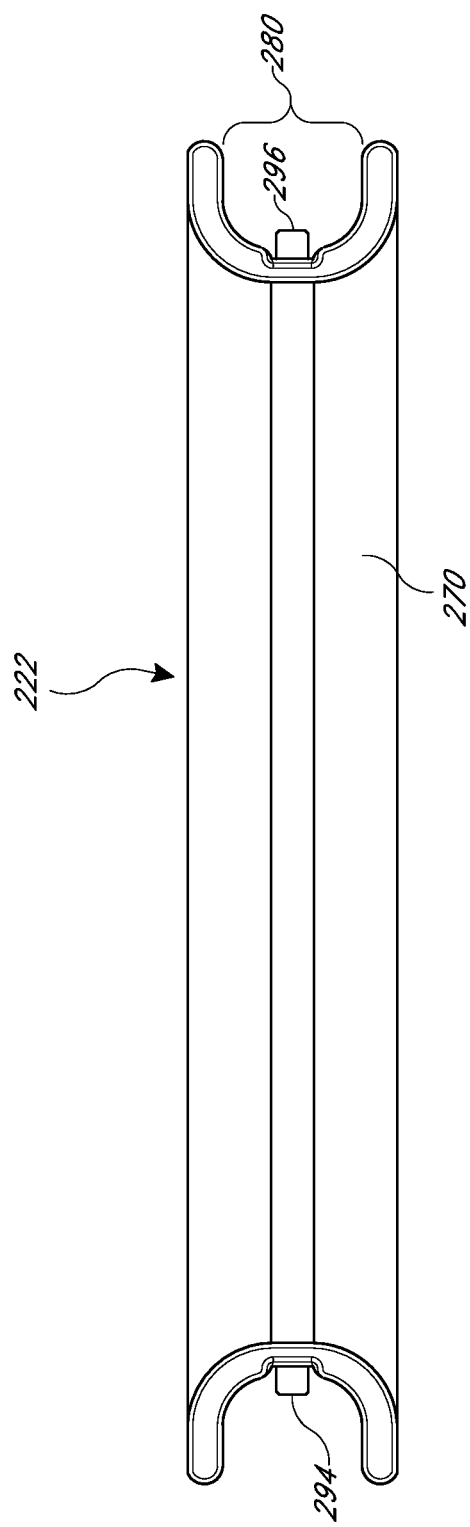
FIG. 9 is an enlarged plan view of the lower bearing member illustrated in FIG. 6.
Figure 10:
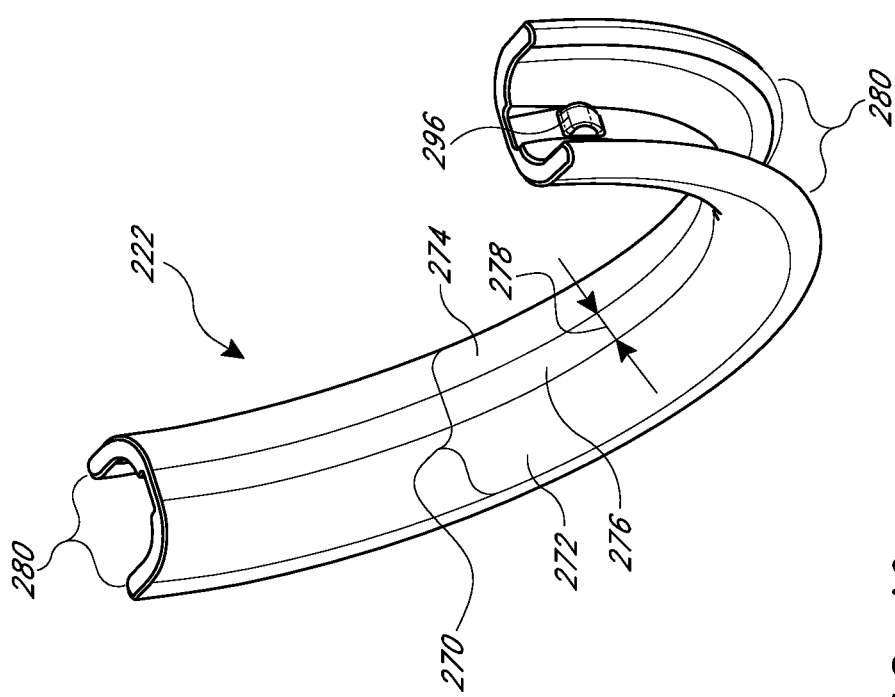
FIG. 10 is a perspective view of the bearing member illustrated in FIG. 9.

With reference to FIGS. 7, 9, and 10, the bearing members 222 can be formed from one or more pieces. In the illustrated embodiments, the bearing members 222 each extend around about 180 degrees around the axis B. The bearing members 222, however, can be made in other sizes. The bearing members 222 are made from a material that provides reduced sliding friction against the outer surface of the torque tubes 16. Thus, the bearing members 222 can be considered as reduced friction members. For example, the bearing members 222 can be made from any material, including ultra high molecular weight polyethylene (UHMWPE) plastic material. However, other materials can also be used, such as grease soaked cotton, wood, Delrin, Nylon, Polyethylene, Polyurethane, Polytetrafluoroethylene, Brass, Polystyrene, Polyoxymethylene, Acrylonitrile butadiene styrene, Polyamide, or Polyphenylene Oxide, other plastics, or other materials.

With the illustrated design, as well as with other designs, the upper and lower bearing members 222 can all be identical in shape. Thus, only one of the bearing members 222 will be described in detail below.

With continued reference to FIGS. 9 and 10, the bearing members 222 can have a generally C-shaped cross-section, and when brought together as shown in FIG. 8, provide a substantially fully circular, partially toroidal, bearing surface. In the illustrated embodiment, the bearing surface can be considered the inner surface 270 of the bearing members 222. The inner surface 270 can have a single radius of curvature or multiple radii of curvature. In the illustrated embodiment, the surface 270 includes outer portions 272, 274 having a single radius of curvature and a central portion 276 that is generally cylindrical, i.e., its cross-section is not curved. In some embodiments, the width 278 of the central portion 276 of the inner surface 270 can have a width of about one-quarter to one-half inch. Other sizes can also be used.

The bearing members 222 also include an outer surface 280. The outer surface 280 can be shaped and configured to cooperate with the outer surfaces 264, 266 of the bearing seats 250, 262 (FIG. 8). The partially toroidal shape of the seats 250, 262 and the complimentarily-shaped, partially toroidal shape of the outer surface 280 of the bearing members 222 can provide particular advantages in the environments of use disclosed above.

For example, these cooperating partially toroidal surfaces cooperate to maintain the bearing members 222 in the desired position against longitudinal loads that may be applied to torque tubes extending through the assembled bearing assembly 20 (as illustrated in FIG. 8), such as forces extending parallel to the axis A, while at the same time providing adequate support for supporting the weight of torque tubes normally supported by the lower portion 224 and the lowermost bearing member 222. However, the upper bearing member 222 and the upper portion 226 of the housing assembly 220 also work to retain the torque tube 16 between the bearing members 222 when the torque tubes experience uplift, for example, caused by aerodynamic forces on the photovoltaic devices 12 (FIG. 1).

Optionally, the bearing assemblies 20 can include connectors for securing the bearing member 222 to one or both of the lower and upper portions 224, 226. As such, the bearing member 222 can be better held in place during a procedure for assembling the solar energy collection system 10. For example, as noted above, during the construction of the system 10, the piers 200 are secured to a ground, by either a pile driving and/or cement foundations. Then, the lower portion 224 of the housing 220 is secured to the pier 200. Then, one bearing member 222 is secured to the bearing seat 250 of the lower portion 224.

In this configuration, torque tube 16 can be lowered down onto all the partially assembled bearing assemblies 20 throughout the system 10. As the torque tubes are lowered onto the bearing members 222, it is possible that the torque tube will be pressed against one side of a bearing member 222. For example, as reflected by the arrow 290 of FIG. 8. Such an unbalanced force against the bearing member 222 can cause the bearing member to slide in an arcuate direction, along the arrow 292. If this type of sliding occurs, the bearing member 222 can be dislodged from its seat 250 and thereby require additional adjustments to the positioning of the bearing member 222 before the bearing assembly 220 can be fully assembled. Thus, adding a connector for connecting the bearing member 222 to the lower portion 224 of the housing 220 can provide an additional benefit in preventing movement of the bearing member 222 during such an installation procedure.

In some embodiments, such a connector can be in the form of protrusions 294, 296 on the outer surface 280 of the bearing members 222. The protrusions 294, 296 can be configured to cooperate with apertures 298, 300 formed on the bearing seat 250 (FIG. 8). In the illustrated embodiment, the protrusions 294, 296 are in the shape of ramped protrusions that are configured to provide a snap fit with the apertures 298, 300, respectively. As such, the bearing 222 can be connected to the bearing seat 250 without any tools. In other words, the protrusions 294, 296 and the apertures 298, 300 cooperate to provide a tool-less connection. Further, the protrusions 294, 296 and the apertures 298, 300 can cooperate with the partially toroidal shapes of the outer surface 280 (FIG. 10) of the bearing members 222 and the partially toroidal shapes of the inner surfaces 264, 266 of the bearing seats to capture the bearing member 222 in the desired position, so as to resist movement, both in axial and circumferential directions.

Similarly, the upper portion 226 can also include similar apertures on its outer surface 266 so as to cooperate with the protrusions 294, 296 on the bearing member 222. Such connections can further simplify an installation procedure.

With continued reference to FIG. 8, the bearing members 222 and the housing 220 can be sized so as to provide a clearance 304 between the outer surface of a torque tube and the inner surface 270 of the bearing members 222. For example, where the torque tube 16 has an outer diameter of approximately 127 millimeters, the clearance 304 can be approximately 2.25 millimeters. As such, the inner diameter defined by the inner surface of the central portion 278 of the inner surface 270 of the bearings 222 can be approximately 4.5 millimeters greater than the outer diameter of the torque tube 16. However, other clearances can also be used.

Using a clearance 304 of approximately 2.25 millimeters results in a bearing assembly 20 that can accommodate an angle of misalignment 306 of up to about nine degrees between the pivot axis A of the torque tube 16 and the central axis B (FIG. 6) defined by the bearing members 222, and still provide a sufficiently low-friction support for the torque tube 16.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A sun-tracking photovoltaic solar collector array, comprising:
    a plurality of photovoltaic devices;
    a support assembly supporting the plurality of photovoltaic devices so as to be pivotable about a pivot axis, the support assembly comprising:
    at least a first pivot supporting the plurality of photovoltaic devices and having an outer surface;
    at least a first bearing supporting the first pivot so as to be pivotable about the pivot axis; and
    at least one pier supporting the first bearing at a position above a support surface, the first bearing comprising at least a first reduced friction member comprising a convex inner surface positioned so as to slide against the outer surface of the first pivot when the first pivot pivots about the pivot axis, the convex inner surface being at least partially toroidal and defining an innermost surface of the first bearing that extends at least partially around the pivot axis, the first reduced friction member defining a central axis;
    wherein the at least partially toroidal inner surface comprises a cross section having a central flat portion and first and second side portions that are curved, wherein a length of the central flat portion is less than a length of each of the first and second curved side portions,
    wherein a space between the first pivot and the convex inner surface of the first reduced friction member defines a clearance such that the first pivot contacts the first curved side portion when the pivot axis is disposed at a first angle relative to the central axis and such that the first pivot contacts the central flat portion when the pivot axis is disposed at the central axis.

2. The sun tracking photovoltaic solar collector array according to claim 1, wherein the first reduced friction member extends around a first arc of at least about 180 degrees.

3. The sun tracking photovoltaic solar collector array according to claim 1, wherein an inner diameter of the at least partially toroidal inner surface is sufficiently larger than an outer diameter of the outer surface of the first pivot such that the pivot axis of the first pivot can be axially offset from the central axis of the first reduced friction member by about nine degrees.

4. The sun tracking photovoltaic solar collector array according to claim 1, wherein the first reduced friction member comprises an outer surface that is at least partially toroidal.

5. The sun tracking photovoltaic solar collector array according to claim 4 wherein the first bearing comprises a bearing seat having an outer surface that is at least partially toroidal and supports the outer surface of the first reduced friction member.

6. The sun tracking photovoltaic solar collector array according to claim 1, wherein the first bearing comprises a bearing seat supporting the first reduced friction member, additionally comprising a connector connecting the first reduced friction member directly to the bearing seat.

7. The sun tracking photovoltaic solar collector array according to claim 6, wherein the connector is tool-less connector.

8. The sun tracking photovoltaic solar collector array according to claim 7, wherein the connector comprises a protrusion on an outer surface of the first reduced friction member that is configured to form a snap fit with an aperture on the bearing seat.

9. The sun tracking photovoltaic solar collector array according to claim 8 additionally comprising at least a second reduced friction member, the bearing further comprising a second bearing seat fixed relative to the first bearing seat and supporting the second reduced friction member, the first and second reduced friction members being arranged so as to extend around a circumference of the outer surface of the first pivot.

10. A bearing assembly configured to provide rotation about a pivot axis, the bearing assembly comprising:
    a bearing housing, the bearing housing having a fixture portion configured to be secured so as to be fixed relative to the ground, the bearing housing further comprising at least a first bearing seat configured to support the first bearing member;
    a shaft configured to rotate about the pivot axis;
    a first bearing member having an outer surface adapted to be supported by the bearing seat and a convex inner surface configured to slidably support a shaft, the convex inner surface being at least partially toroidal and defining an innermost surface of the first bearing member that extends at least partially around the pivot axis, the first bearing member defining a central axis,
    wherein the at least partially toroidal inner surface comprises a cross section having a central flat portion and first and second side portions that are curved, wherein a length of the central flat portion is less than a length of each of the first and second curved side portions,
    wherein a space between the shaft and the convex inner surface of the first bearing member defines a clearance such that the shaft contacts the first curved side portion when the pivot axis is disposed at a first angle relative to the central axis and such that the shaft contacts the central flat portion when the pivot axis is disposed at the central axis.

11. The bearing assembly according to claim 10, wherein the first bearing member comprises an outer surface that is at least partially toroidal.

12. The bearing assembly according to claim 11, wherein the first bearing seat comprises an inner surface that is at least partially toroidal and adapted to be received within the at least partially toroidal outer surface of the first bearing member.

13. The bearing assembly according to claim 12 additionally comprising a connector directly connecting the first bearing member to the first bearing seat.

14. The bearing assembly according to claim 13, wherein the connector comprises a tool-less connector configured to cooperate with partially toroidal inner surface of the first bearing seat and partially toroidal outer surface of the first bearing member to capture the first bearing member against the first bearing seat.

15. The bearing assembly according to claim 10, additionally comprising a connector connecting the first bearing member directly to the first bearing seat.

16. The bearing assembly according to claim 13, wherein the connector is tool-less connector.

17. The bearing assembly according to claim 10 additionally comprising at least a second bearing member having an inner surface that is at least partially toroidal, the bearing housing further comprising a second bearing seat fixed relative to the first bearing seat and supporting the second bearing member, the first and second bearing members being arranged so as to extend around a circumference of an outer surface of the shaft.

18. The sun tracking photovoltaic solar collector array according to claim 1, wherein the first bearing comprises a bearing housing assembly having a face portion disposed adjacent the at least one pier, wherein a center line of the first reduced friction member is offset from the face portion along the pivot axis.

19. The sun tracking photovoltaic solar collector array according to claim 1, wherein the at least partially toroidal inner surface comprises first and second curved, convex side areas and a cylindrical central area between the first and second side areas, wherein the cylindrical central area is less than each of the first and second side areas.

20. The sun tracking photovoltaic solar collector array according to claim 19, wherein the first and second side areas have the same radius of curvature.

21. The sun tracking photovoltaic solar collector array according to claim 19, wherein the first and second side areas and the cylindrical central area act as a bearing surface for the first pivot.

22. A sun-tracking photovoltaic solar collector array, comprising:
- a plurality of photovoltaic devices;
- a support assembly supporting the plurality of photovoltaic devices so as to be pivotable about a pivot axis, the support assembly comprising:
- at least a first pivot supporting the plurality of photovoltaic devices and having an outer surface;
- at least a first bearing supporting the first pivot so as to be pivotable about the pivot axis; and
- at least one pier supporting the first bearing at a position above a support surface, the first bearing comprising at least a first reduced friction member comprising a convex inner surface positioned so as to slide against the outer surface of the first pivot when the first pivot pivots about the pivot axis, the convex inner surface being at least partially toroidal and defining an innermost surface of the first bearing that extends at least partially around the pivot axis, the first reduced friction member defining a central axis;
- wherein the at least partially toroidal inner surface comprises a curved surface, and
- wherein a space between the first pivot and the inner convex surface of the first reduced friction member defines a clearance such that the first pivot contacts the curved surface when the pivot axis is disposed at a first angle relative to the central axis.

* * * * *